United States Patent
Kim et al.

(10) Patent No.: US 9,589,675 B2
(45) Date of Patent: Mar. 7, 2017

(54) SEMICONDUCTOR APPARATUS AND REPAIR METHOD THEREOF

(71) Applicant: SK hynix Inc., Icheon-si, Gyeonggi-do (KR)

(72) Inventors: Jong Sam Kim, Icheon-si (KR); Jin Hee Cho, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 14/918,816

(22) Filed: Oct. 21, 2015

(65) Prior Publication Data

US 2017/0018316 A1 Jan. 19, 2017

(30) Foreign Application Priority Data

Jul. 14, 2015 (KR) .................... 10-2015-0099871

(51) Int. Cl.
| | |
|---|---|
| *G11C 17/16* | (2006.01) |
| *G11C 17/18* | (2006.01) |
| *G11C 17/14* | (2006.01) |
| *G11C 29/00* | (2006.01) |

(52) U.S. Cl.
CPC .............. *G11C 29/76* (2013.01); *G11C 17/16* (2013.01); *G11C 17/14* (2013.01); *G11C 17/143* (2013.01); *G11C 17/165* (2013.01); *G11C 17/18* (2013.01)

(58) Field of Classification Search
CPC ....... G11C 17/16; G11C 17/18; G11C 17/165; G11C 17/14; G11C 17/143
USPC ................................................. 365/96, 225.7
See application file for complete search history.

(56) References Cited

U.S. PATENT DOCUMENTS

| | | | | |
|---|---|---|---|---|
| 2007/0033449 | A1* | 2/2007 | Hwang ................. | G11C 29/02 714/710 |
| 2016/0042805 | A1* | 2/2016 | Park ...................... | G11C 17/16 365/96 |

FOREIGN PATENT DOCUMENTS

KR 1020150001133 A 1/2015

* cited by examiner

*Primary Examiner* — Ly D Pham
(74) *Attorney, Agent, or Firm* — William Park & Associates Ltd.

(57) ABSTRACT

A semiconductor apparatus includes a memory region; a fuse array including a plurality of fuse groups, each fuse group being configured to store a failed address of the memory region; a remaining-fuse information storage unit configured to store remaining-fuse information on a fuse group that includes a fuse corresponding to the failed address among the plurality of fuse groups; and a control unit configured to perform a control operation for updating the remaining-fuse information for the fuse group that includes a fuse corresponding to the failed address among the plurality of fuse groups and for storing the failed address when the failed address is detected.

7 Claims, 4 Drawing Sheets

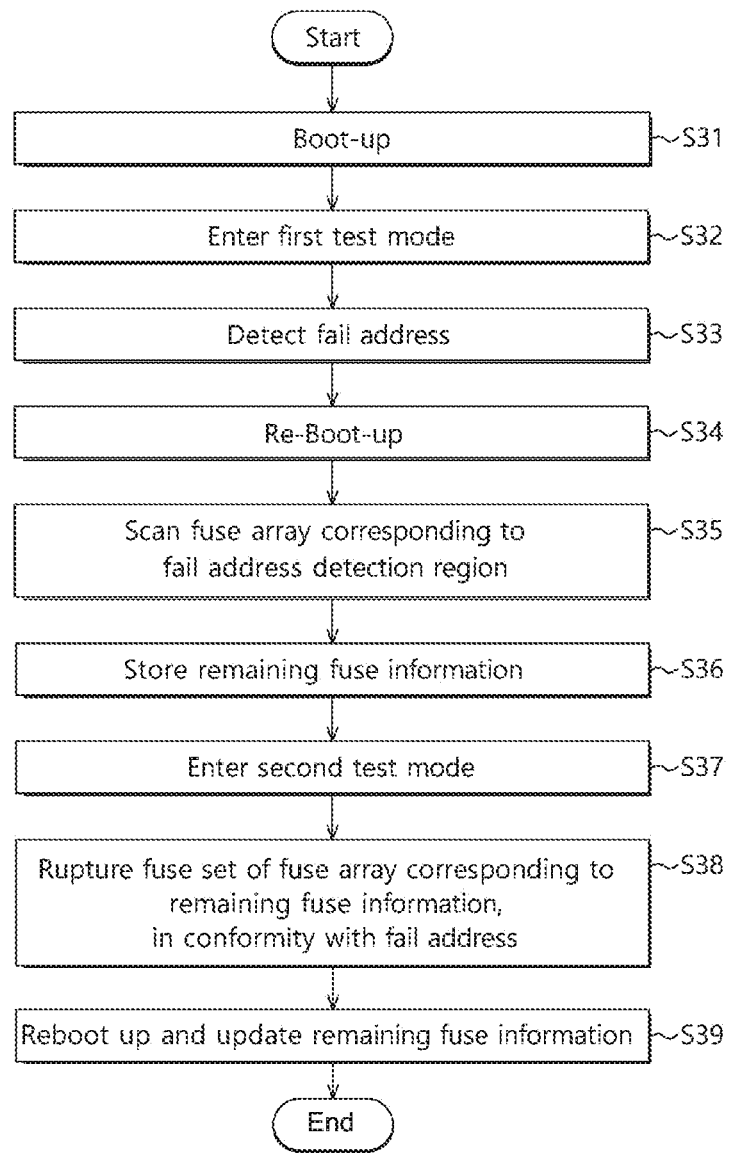

SEMICONDUCTOR APPARATUS AND REPAIR METHOD THEREOF

CROSS-REFERENCES TO RELATED APPLICATION

The present application claims priority under 35 U.S.C. §119(a) to Korean application number 10-2015-0099871 filed on Jul. 14, 2015, in the Korean Intellectual Property Office, which is incorporated herein by reference in its entirety.

BACKGROUND

1. Technical Field

Various embodiments generally relate to a semiconductor circuit, and more particularly to a semiconductor apparatus and a repair method thereof.

2. Related Art

A semiconductor apparatus may be designed to include fuses to store information on redundancy cells that replace abnormal memory cells.

Modern semiconductor devices allow a repair operation to be performed even after their packaging processes have been completed by using an e-fuse technology. An e-fuse may be programmed by a rupture operation that may be performed after packaging the device.

SUMMARY

Various embodiments are directed to a semiconductor apparatus and a repair method thereof capable of performing a stable repair operation and decreasing the number of latches.

In an embodiment, a semiconductor apparatus may include: a memory region; a fuse array including a plurality of fuse groups, and configured to store a fail address of the memory region; a remaining fuse information storage unit configured to store a remaining fuse information of any one fuse group corresponding to the fail address among the plurality of fuse groups; and a control unit configured to perform a control operation for updating the remaining fuse information for any one fuse group corresponding to the fail address among the plurality of fuse groups and for storing the fail address, when the fail address is detected.

In an embodiment, a method for repairing a semiconductor apparatus including a fuse array which is divided into a plurality of fuse groups and a memory region may include: booting up the semiconductor apparatus when a fail address is detected in a first test mode; scanning any one fuse group corresponding to the fail address among the plurality of fuse groups, and storing a corresponding remaining fuse information; and storing the fail address in a fuse set corresponding to the remaining fuse information among a plurality of fuse sets of the any one fuse group in a second test mode.

In an embodiment, a method for repairing a semiconductor apparatus including a fuse array which is divided into a plurality of fuse groups and a memory region may include: booting up the semiconductor apparatus; entering the semiconductor apparatus in a first test mode, and detecting a fail address by testing the memory region; rebooting up the semiconductor apparatus when the fail address is detected; scanning any one fuse group corresponding to the fail address among the plurality of fuse groups, and storing a corresponding remaining fuse information; and entering the semiconductor apparatus in a second test mode, and rupturing a fuse set corresponding to the remaining fuse information among a plurality of fuse sets of the any one fuse group, in conformity with the fail address.

BRIEF DESCRIPTION OF THE DRAWINGS

FIG. 4 is a flow chart provided to explain an example repair method of the semiconductor apparatus in accordance with an embodiment.

DETAILED DESCRIPTION

Hereinafter, a semiconductor apparatus and a repair method thereof will be described below with reference to the accompanying drawings through various examples of embodiments.

Figure 1:
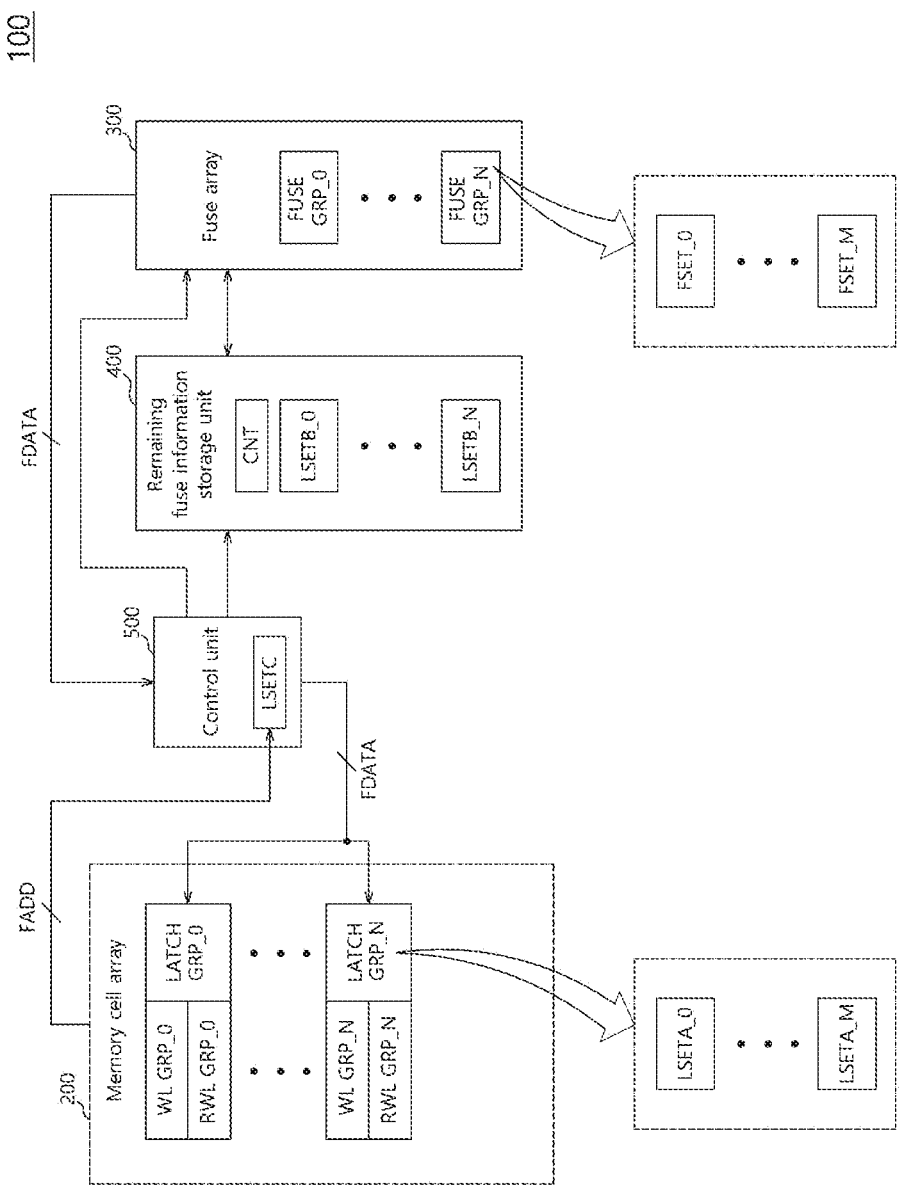
FIG. 1 is a block diagram illustrating an example of a semiconductor apparatus 100 in accordance with an embodiment.

As shown in FIG. 1, a semiconductor apparatus 100 in accordance with an embodiment may include a memory region 200, a fuse array 300, a remaining-fuse information storage unit 400, and a control unit 500.

The memory region 200 may include a memory cell array, a plurality of word lines, a plurality of redundant word lines, and a plurality of latches.

The memory cell array may be subdivided into a plurality of unit memory blocks such as banks.

Again, each bank may be subdivided into a plurality of smaller unit memory blocks such as mats.

The plurality of word lines may be coupled to the memory cell array. The memory cells may be accessed from the plurality of word lines according to row address.

The plurality of word lines may be grouped into a plurality of word line groups WL GRP_0 to WL GRP_N.

Examples of the plurality of word line groups WL GRP_0 to WL GRP_N may include the mats.

The plurality of redundant word lines may replace word lines that have been found to be defective or related to defective memory cells. For instance, a word line may be found to be defective when the word line is coupled to a defective memory cell, or when the word line itself has a defect. An address corresponding to the word line found to be defective may be referred to as a "failed address."

The plurality of redundant word lines may be grouped into a plurality of redundant word line groups RWL GRP_0 to RWL GRP_N.

Each of the redundant word line groups RWL GRP_0 to RWL GRP_N may be allocated to one of the word line groups WL GRP_0 to WL GRP_N.

The plurality of latches may be grouped into a plurality of latch groups LATCH GRP_0 to LATCH GRP_N.

Each of the latch groups LATCH GRP_0 to LATCH GRP_N may be allocated to one of the redundant word line groups RWL GRP_0 to RWL GRP_N.

Each of the plurality of latch groups LATCH GRP_0 to LATCH GRP_N may include a plurality of latch sets LSETA_0 to LSETA_M.

Here, each of the latch sets LSETA_0 to LSETA_M may be used to store the failed address. In an embodiment, the failed address may consist of thirteen bits.

The fuse array 300 may be grouped into a plurality of fuse groups FUSE GRP_O to FUSE GRP_N.

Each of the fuse groups FUSE GRP_O to FUSE GRP_N may be allocated to one of the latch groups LATCH GRP_0 to LATCH GRP_N.

Each of the fuse groups FUSE GRP_O to FUSE GRP_N may include a plurality of fuse sets FSET_0 to FSET_M.

Each of the fuse sets FSET_0 to FSET_M may store the failed address. In an embodiment, the failed address may consist of thirteen bits.

Each of the plurality of fuse sets FSET_0 to FSET_M may include a plurality of fuses, the number of which corresponds to the number of bits of the failed address.

The plurality of fuse sets FSET_0 to FSET_M may include e-fuses.

The failed addresses may be stored in the plurality of fuse sets FSET_0 to FSET_M through a rupture operation.

Each of the fuse sets FSET_0 to FSET_M may include an enable fuse for indicating whether a corresponding fuse set has been used or not.

For instance, if the enable fuse has been ruptured, this indicates that a corresponding fuse set has been used.

The remaining-fuse information storage unit 400 may store information on the fuses that have not been used among fuses in each of the fuse groups FUSE GRP_O to FUSE GRP_N.

The remaining-fuse information may include information on the number of available fuse sets (e.g., fuse sets that have never been used) among the plurality of fuse sets FSET_0 to FSET_M of each of the fuse groups FUSE GRP_O to FUSE GRP_N.

The remaining-fuse information storage unit 400 may include a counter CNT and a plurality of latch sets LSETB_0 to LSETB_N.

Each of the latch sets LSETB_0 to LSETB_N may be allocated to one of the fuse groups FUSE GRP_O to FUSE GRP_N of the fuse array 300.

The counter CNT may update information on the remaining-fuse information, which is stored in the plurality of latch sets LSETB_0 to LSETB_N, to reflect the latest remaining-fuse information. The counter CNT may operate in response to various control signals provided by the control unit 500.

The control unit 500 may generate various control signals necessary to a repair process.

The semiconductor apparatus 100 may enter a boot-up mode in response to a control signal of the control unit 500.

The control unit 500 may generate control signals for storing, in the remaining-fuse information storage unit 400, the remaining-fuse information acquired by scanning the fuse array 300 and for storing a failed address, which has been detected during a test mode, in the fuse array 300 according to the remaining-fuse information.

The control unit 500 may include a latch set LSETC for storing a failed address detected by a test operation performed during a test mode.

Figure 2:
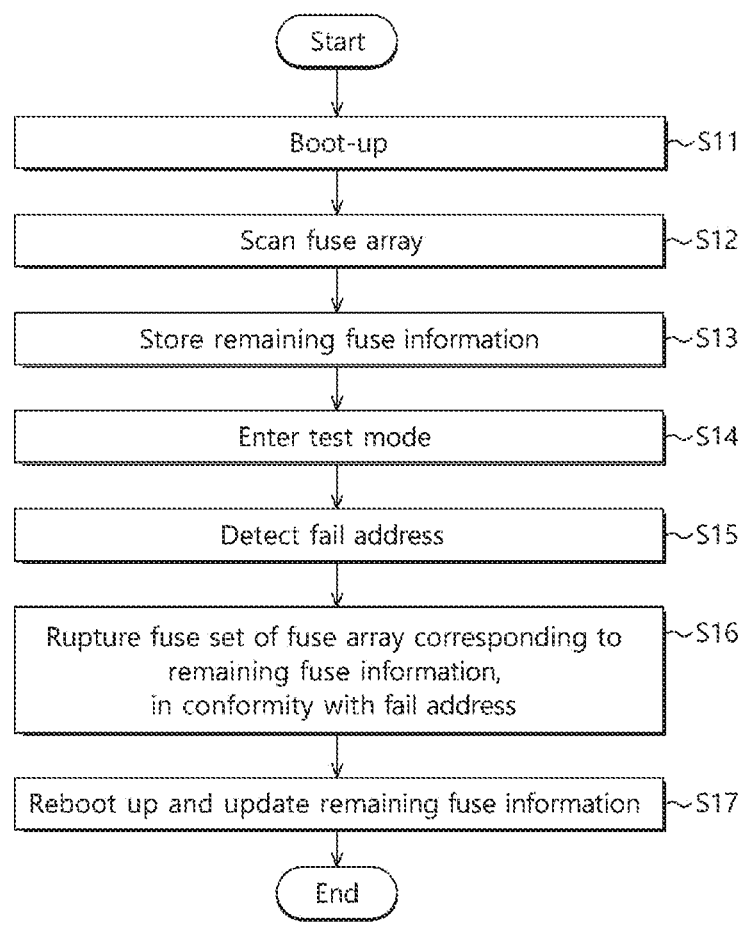
FIG. 2 is a flow chart provided to explain an example repair method of the semiconductor apparatus 100 in accordance with an embodiment.

A repair operation of the semiconductor apparatus 100 in accordance with an embodiment will be described below with reference to FIGS. 1 and 2. Referring to FIG. 2, the repair operation of the semiconductor apparatus 100 involves several operation steps S11-S17.

First, in the step S11, the semiconductor apparatus 100 enters a boot-up mode.

The step S11 may be performed in response to a control signal provided by the control unit 500.

Next, in the step S12, the control unit 500 scans the fuse array 300 during the period of the boot-up mode.

The step S12 involves determining whether certain fuse sets among the pluralities of fuse sets FSET_0 to FSET_M have been used or not.

In an embodiment, each of the fuse sets FSET_0 to FSET_M may include an enable fuse, which may indicate whether or not a corresponding fuse set has been used.

Therefore, the step S12 may be performed by determining whether or not the enable fuses of each of the fuse sets FSET_0 to FSET_M have been ruptured.

In the step S13, the remaining-fuse information detected in the step S12 may be stored in the remaining-fuse information storage unit 400.

The step S13 involves storing, in the plurality of latch sets LSETB_0 to LSETB_N of the remaining-fuse information storage unit 400, the respective remaining-fuse information of the plurality of fuse groups FUSE GRP_O to FUSE GRP_N of the fuse array 300 Each of the latch sets LSETB_0 to LSETB_N of the remaining-fuse information storage unit 400 be allocated to one of the fuse groups FUSE GRP_O to FUSE GRP_N.

In the step S13, the control unit 500 may provide control signals to the remaining-fuse information storage unit 400. The counter CNT of the remaining-fuse information storage unit 400 may update information on the remaining-fuse information, which is stored in the plurality of latch sets LSETB_0 to LSETB_N in response to control signals provided by the control unit 500.

Provided that each of the plurality of fuse groups FUSE GRP_O to FUSE GRP_N includes thirty two fuse sets, the thirty two fuse sets may be represented by a five digit binary code.

For instance, '11111' may represent that the number of remaining fuse sets is thirty two, and '11110' may represent that the number of remaining fuse sets is thirty one. In a case where the number of used fuse sets is changed, the counter CNT of the remaining-fuse information storage unit 400 may update remaining-fuse information by changing values of the plurality of latch sets LSETB_0 to LSETB_N.

Accordingly, each of the plurality of latch sets LSETB_0 to LSETB_N may store the five digit binary code as remaining-fuse information.

In the step S14, the semiconductor apparatus 100 enters a test mode.

In the step 15, a test for the memory cell array of the memory region 200 is performed, and an address corresponding to a failed memory cell, that is, a failed address is detected.

In the step 16, a fuse set of the fuse array 300 is ruptured on the basis of the failed address and remaining-fuse information.

The control unit 500 may select a fuse group corresponding to the failed address among the plurality of fuse groups FUSE GRP_O to FUSE GRP_N. For example, the control unit 500 may select the fuse group FUSE GRP_O.

Also, the control unit 500 may control the fuse array 300 such that an unused fuse set among the plurality of fuse sets FSET_0 to FSET_M of the fuse group FUSE GRP_O is ruptured according to the remaining-fuse information.

The plurality of fuse sets FSET_0 to FSET_M may be sequentially ruptured in order of the fuse sets FSET_0, FSET_1, . . . FSET_M each time a failed address is detected.

If the fuse set FSET_0 among the plurality of fuse sets FSET_0 to FSET_M is ruptured, remaining-fuse information may have a value indicating that the fuse set FSET_0 has been used.

For example, the control unit 500 may have the unused fuse set FSET_1 among the plurality of fuse sets FSET_0 to FSET_M of the fuse group FUSE GRP_O be ruptured according to the remaining-fuse information.

In the step S17, the control unit 500 reboots up the semiconductor apparatus 100 and updates remaining-fuse information by scanning the fuse array 300.

The control unit 500 may read fuse data FDATA, that is, the failed addresses stored in the fuse array 300, and may store the read fuse data FDATA in the plurality of latch groups LATCH GRP_0 to LATCH GRP_N of the memory region 200.

Figure 3:
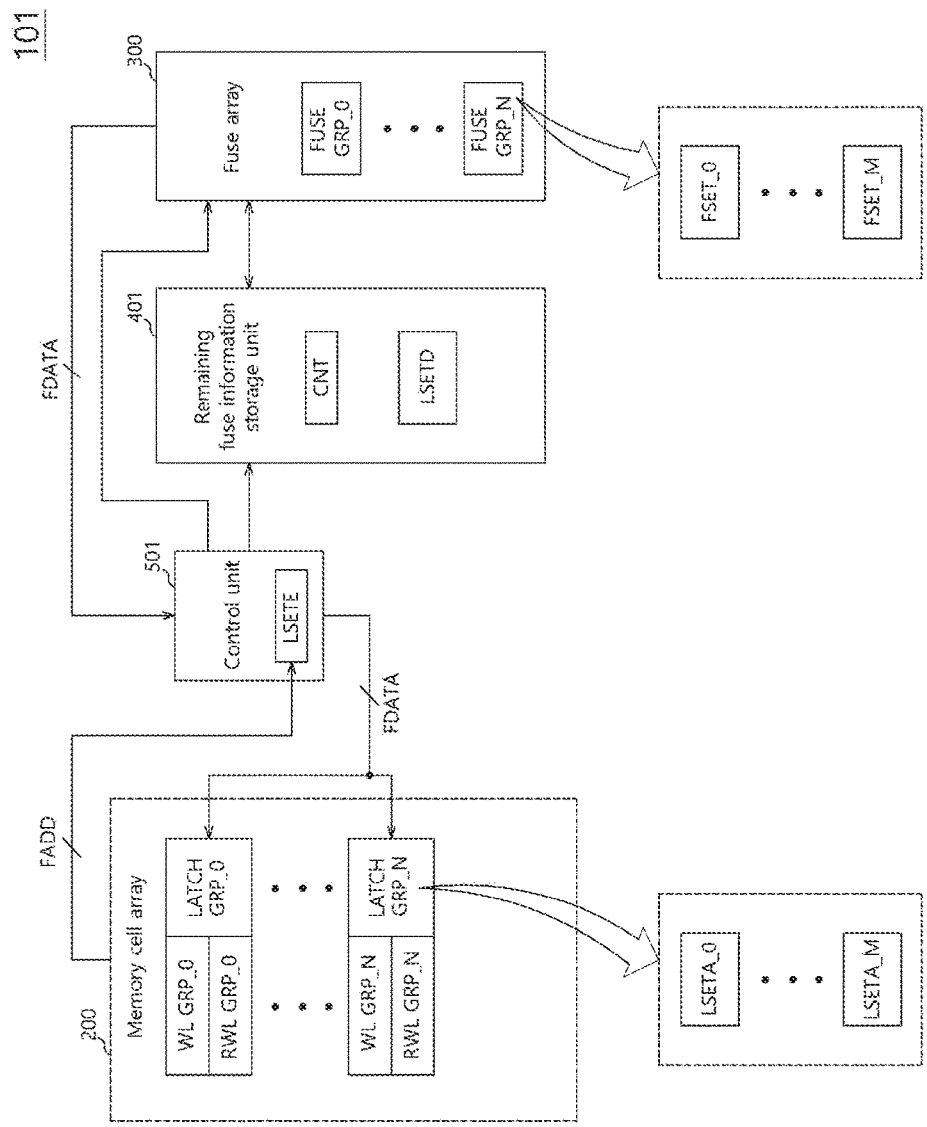
FIG. 3 is a block diagram illustrating an example of a semiconductor apparatus 101 in accordance with an embodiment.

Referring to FIG. 3, a semiconductor apparatus 101 in accordance with an embodiment may include a memory region 200, a fuse array 300, a remaining-fuse information storage unit 401, and a control unit 501.

In an embodiment, a remaining fuse information storage unit 401 has only one latch set LSETD. Further, instead of storing the remaining fuse information of all of the plurality of fuse groups FUSE GRP_O to FUSE GRP_N by scanning the whole fuse array 300, remaining-fuse information may be updated each time any failed address is detected, and corresponding fuse set rupture operation is performed for only a fuse group corresponding to the failed address among the plurality of fuse groups FUSE GRP_O to FUSE GRP_N each time a failed address is detected. In other words, the remaining-fuse information storage unit 401, therefore, stores only the remaining-fuse information on a fuse group corresponding to the failed address, whereas does not store the remaining-fuse information on a fuse group that does not involve the failed address.

A semiconductor apparatus 101 in accordance with an embodiment may include a memory region 200, a fuse array 300, the remaining-fuse information storage unit 401, and a control unit 501.

The memory region 200 may include a memory cell array, a plurality of word lines, a plurality of redundant word lines, and a plurality of latches.

The memory cell array may be subdivided into a plurality of unit memory blocks such as banks.

Again, each bank may be subdivided into a plurality of smaller unit memory blocks such as mats.

The plurality of word lines may be coupled to the memory cell array. The memory cells may be accessed from the plurality of word lines according to a row address.

The plurality of word lines may be grouped into a plurality of word line groups WL GRP_0 to WL GRP_N.

Examples of the plurality of word line groups WL GRP_0 to WL GRP_N may include the mats.

The plurality of redundant word lines may replace a word lines that have been found to be defective. For instance, a word line may be found to be defective when the word line is coupled to a defective memory cell, or when the word line itself has a defect. An address corresponding to the word line found to be defective may be referred to as the failed address.

The plurality of redundant word lines may be grouped into a plurality of redundant word line groups RWL GRP_0 to RWL GRP_N.

Each of the redundant word line groups RWL GRP_0 to RWL GRP_N may be allocated to one of the word line groups WL GRP_0 to WL GRP_N.

The plurality of latches may be grouped into a plurality of latch groups LATCH GRP_0 to LATCH GRP_N.

Each of the latch groups LATCH GRP_0 to LATCH GRP_N may be allocated to one of the redundant word line groups RWL GRP_0 to RWL GRP_N.

Each of the plurality of latch groups LATCH GRP_0 to LATCH GRP_N may include a plurality of latch sets LSETA_0 to LSETA_M.

Here, each of the latch sets LSETA_0 to LSETA_M may be used to store the failed address. In an embodiment, the failed address may consist of thirteen bits.

The fuse array 300 may be grouped into a plurality of fuse groups FUSE GRP_O to FUSE GRP_N.

Each of the fuse groups FUSE GRP_O to FUSE GRP_N may be allocated to one of the latch groups LATCH GRP_0 to LATCH GRP_N.

Each of the fuse groups FUSE GRP_O to FUSE GRP_N may include a plurality of fuse sets FSET_0 to FSET_M.

Each of the fuse sets FSET_0 to FSET_M may store a failed address. In an embodiment, the failed address may consist of thirteen bits.

Each of the plurality of fuse sets FSET_0 to FSET_M may include a plurality of fuses, the number of which corresponds to the number of bits of the failed address.

The plurality of fuse sets FSET_0 to FSET_M may include e-fuses.

The failed addresses may be stored in the plurality of fuse sets FSET_0 to FSET_M through a rupture operation.

Each of the fuse sets FSET_0 to FSET_M may include an enable fuse for indicating whether a corresponding fuse set has been used or not.

For instance, if the enable fuse has been ruptured, this indicates that a corresponding fuse set has been used.

The remaining-fuse information storage unit 401 may store information on the fuses that have not been used among fuses in each of the fuse group corresponding to a currently detected failed address among the plurality of fuse groups FUSE GRP_O to FUSE GRP_N.

The remaining-fuse information may include information on the number of available (e.g., fuse sets that have not been used) among the plurality of fuse sets FSET_0 to FSET_M of any one among the plurality of fuse groups FUSE GRP_O to FUSE GRP_N.

The remaining-fuse information storage unit 401 may include a counter CNT and the latch set LSETD.

The latch set LSETD may correspond to all the plurality of fuse groups FUSE GRP_O to FUSE GRP_N of the fuse array 300, respectively.

The counter CNT may update information on the remaining-fuse information, which is stored in the latch set LSETD, to reflect the latest remaining-fuse information. The counter CNT may operate in response to various control signals provided by the control unit 501.

The control unit 501 may generate various control signals necessary to a repair process.

The semiconductor apparatus 101 may enter a boot-up mode in response to a control signal of the control unit 500.

The control unit 501 may generate control signals for updating remaining-fuse information for one fuse group corresponding to a failed address among the plurality of fuse groups FUSE GRP_O to FUSE GRP_N of the fuse array 300 and for storing a failed address each time a failed address is detected.

The control unit 501 may include a latch set LSETE for storing a failed address detected by a test operation performed during a test mode.

A repair operation of the semiconductor apparatus 101 in accordance with an embodiment will be described below with reference to FIGS. 3 and 4. Referring to FIG. 4, the repair operation of the semiconductor apparatus 100 involves several operation steps S31-S39.

First, in the step S31, the semiconductor apparatus 101 enters a boot-up mode.

The step S31 may be performed in response to a control signal provided by the control unit 501.

In the step S32, the semiconductor apparatus 101 enters a first test mode.

In the step S33, a test is performed in the first test mode. That is, a test is performed on the memory cell array of the memory region 200 to detect a failed address (e.g., an address corresponding to a failed memory cell).

In the step S34, the semiconductor apparatus 101 is rebooted up.

In the step S35, the control unit 501 scans a fuse group corresponding to the failed address among the plurality of fuse groups FUSE GRP_O to FUSE GRP_N of the fuse array 300.

As described above, each of the plurality of fuse sets FSET_0 to FSET_M may include an enable fuse indicating whether or not a corresponding fuse set has been used.

Therefore, the step S35 may be performed by determining whether or not the enable fuses of each of the fuse sets FSET_0 to FSET_M of one fuse group corresponding to the failed address among the plurality of fuse groups FUSE GRP_O to FUSE GRP_N have been ruptured.

In the step S36, the remaining-fuse information detected in the step S35 may be stored in the remaining-fuse information storage unit 401.

The control unit 501 controls the remaining-fuse information storage unit 401, and the counter CNT of the remaining-fuse information storage unit 401 may update information on the remaining-fuse information, which is stored in the latch set LSETE.

In the step S37, the semiconductor apparatus 101 enters a second test mode.

In the step S38, an operation is performed in the second test mode. That is, a fuse set of the fuse array 300 is ruptured on the basis of the failed address in correspondence to the remaining-fuse information.

The control unit 501 may select a fuse group corresponding to the failed address among the plurality of fuse groups FUSE GRP_O to FUSE GRP_N. For example, the control unit 501 may select the fuse group FUSE GRP_O.

Also, the control unit 501 may control the fuse array 300 such that an unused fuse set among the plurality of fuse sets FSET_0 to FSET_M of the fuse group FUSE GRP_O is ruptured according to the remaining-fuse information.

The plurality of fuse sets FSET_0 to FSET_M may be sequentially ruptured in order of the fuse sets FSET_0, FSET_1, . . . FSET_M each time a failed address is detected.

If the fuse set FSET_0 among the plurality of fuse sets FSET_0 to FSET_M is ruptured, remaining-fuse information may have a value indicating that the fuse set FSET_0 has been used.

For example, the control unit 501 may have the unused fuse set FSET_1 among the plurality of fuse sets FSET_0 to FSET_M of the fuse group FUSE GRP_O be ruptured according to the remaining-fuse information.

In the step S39, the control unit 501 reboots up the semiconductor apparatus 101, and updates remaining-fuse information by scanning the fuse array 300.

The control unit 501 may read fuse data FDATA, that is, the failed addresses stored in the fuse array 300, and may store the read fuse data FDATA in the plurality of latch groups LATCH GRP_O to LATCH GRP_N of the memory region 200.

While various embodiments have been described above, it will be understood to those skilled in the art that the embodiments described are examples only. Accordingly, the semiconductor apparatus and the repair method thereof described herein should not be limited based on the described embodiments.

What is claimed is:

1. A semiconductor apparatus comprising:
   a memory region;
   a fuse array including a plurality of fuse groups, each fuse group being configured to store a failed address of the memory region;
   a remaining-fuse information storage unit configured to store remaining-fuse information on a fuse group that includes a fuse corresponding to the failed address among the plurality of fuse groups; and
   a control unit configured to perform a control operation for updating the remaining-fuse information for the fuse group that includes the fuse corresponding to the failed address among the plurality of fuse groups and for storing the failed address when the failed address is detected.

2. The semiconductor apparatus according to claim 1, wherein the memory region comprises:
   a memory cell array;
   a plurality of word line groups coupled to the memory cell array;
   a plurality of redundant word line groups for replacing word line groups that are found to be defective or related to defective memory cells; and
   a plurality of latch groups corresponding to the plurality of fuse groups.

3. The semiconductor apparatus according to claim 1, wherein the remaining-fuse information indicates a number of available fuse sets among a plurality of fuse sets included in the fuse group that includes the fuse corresponding to the failed address.

4. The semiconductor apparatus according to claim 3, wherein the available fuse sets includes fuse sets that have never been used.

5. The semiconductor apparatus according to claim 1, wherein the remaining-fuse information storage unit comprises:
   a latch set configured to store the remaining-fuse information; and
   a counter configured to change a value stored in the latch set on the basis of the remaining-fuse information.

6. The semiconductor apparatus according to claim 1, wherein the control unit comprises a latch set for storing the failed address.

7. The semiconductor apparatus according to claim 1, wherein the remaining-fuse information storage unit does not store the remaining-fuse information on a fuse group that does not involve any failed address.

* * * * *